(12) United States Patent
Jang

(10) Patent No.: US 8,854,913 B2
(45) Date of Patent: Oct. 7, 2014

(54) ADDRESS DECODER, SEMICONDUCTOR MEMORY DEVICE INCLUDING THE SAME, METHOD OF OPERATING THE SAME

(71) Applicant: SK hynix Inc., Icheon-si (KR)

(72) Inventor: Chae Kyu Jang, Gyeonggi-do (KR)

(73) Assignee: SK Hynix Inc., Icheon-Si (KR)

( * ) Notice: Subject to any disclaimer, the term of this patent is extended or adjusted under 35 U.S.C. 154(b) by 9 days.

(21) Appl. No.: 13/717,160

(22) Filed: Dec. 17, 2012

(65) Prior Publication Data

US 2014/0043929 A1 Feb. 13, 2014

(30) Foreign Application Priority Data

Aug. 8, 2012 (KR) ........................ 10-2012-0086899

(51) Int. Cl.
  *G11C 8/00* (2006.01)
  *G11C 8/12* (2006.01)
(52) U.S. Cl.
  CPC ........................................ *G11C 8/12* (2013.01)
  USPC ................................ 365/230.04; 365/230.06

(58) Field of Classification Search
  USPC ........................... 365/230.06, 230.04, 230.03
  See application file for complete search history.

(56) References Cited

U.S. PATENT DOCUMENTS 8,068,365 B2 * 11/2011 Kim ........................ 365/185.12

FOREIGN PATENT DOCUMENTS

| KR | 1020030019042 A | 3/2003 |
| KR | 1020090108451 A | 10/2009 |
| KR | 1020110093088 A | 8/2011 |

* cited by examiner

*Primary Examiner* — Huan Hoang
(74) *Attorney, Agent, or Firm* — Haynes and Boone, LLP

(57) ABSTRACT

A semiconductor memory device and method of operating the same is disclosed. The semiconductor memory device includes an address decoder including pass transistor groups, a memory block selector coupled in common to the pass transistor groups, and a block decoding section configured to deliver an enable signal through the block word line based on a block group address. The memory block selector is configured to deliver the enable signal to a first pass transistor group selected from the pass transistor groups in response to a block select signal to activate the first pass transistor group.

19 Claims, 8 Drawing Sheets

ADDRESS DECODER, SEMICONDUCTOR MEMORY DEVICE INCLUDING THE SAME, METHOD OF OPERATING THE SAME

CROSS-REFERENCE TO RELATED APPLICATION

This application claims priority from Korean Patent Application No. 10-2012-0086899, filed on Aug. 8, 2012, the contents of which are incorporated herein by reference in its entirety.

BACKGROUND

The present invention relates to a semiconductor memory device.

A semiconductor memory device may include memory devices embodied by using a semiconductor such as silicon Si, germanium Ge, gallium arsenide GaAs, indium phosphide InP, etc. The semiconductor memory device may be divided into a volatile memory device and a non-volatile memory device.

Volatile memory devices may include memory devices where stored data becomes lost if a power is not supplied. The volatile memory devices may include a static RAM SRAM, a dynamic RAM DRAM, a synchronous DRAM SDRAM and so on. Non-volatile memory devices may include memory devices where stored data remains though a power is not supplied. The non-volatile memory devices may include a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. Flash memory devices may include NOR-type memory devices and NAND-type memory devices.

Accordingly, it would be advantageous to reduce the area of a peripheral circuit for driving a memory cell array while retaining a high integrity of the semiconductor memory device.

SUMMARY OF THE INVENTION

Exemplary embodiment of the present invention reduces area of a semiconductor memory device.

An address decoder according to one embodiment includes pass transistor groups; a memory block selector coupled in common to the pass transistor groups; and a block decoding section coupled to the memory block selector through a block word line, and configured to deliver an enable signal through the block word line based on a block group address. The memory block selector is configured to deliver the enable signal to a first pass transistor group selected from the pass transistor groups according to a block select signal to activate first the pass transistor group.

The block group address and the block select signal may be included in a block address received from an external circuit for accessing a memory block.

A semiconductor memory device according to another embodiment includes memory block groups, each of the memory block groups including memory blocks; first block select sections, each of the first block select sections being coupled to a respective memory block group selected from the memory block groups and configured to receive a block select signal in common; and first block decoding sections, each of the first block decoding sections being coupled to a respective block selection section selected from the first block select sections. A block select section from the first block select sections is selected based on a block group address. The selected block select section is configured to select a first memory block in a corresponding one of the memory block groups based on the block select signal.

In yet another embodiment, the semiconductor memory device further includes second block select sections, each of the second block select sections being coupled to a respective memory block group selected from the memory block groups and configured to receive the block select signal in common; and second block decoding sections, each of the second block decoding sections being coupled to a respective block selection section selected from the second block select section. A block selection section from the second block select sections is selected based on the block group address. The selected second block select section selects the first memory block based on the block select signal.

In yet another embodiment, each of the memory blocks includes a first to an mth cell strings disposed in sequence, m being a positive integer. Each of the first block select sections is coupled to a first to a (j−1)th cell strings of the first to the mth cell strings through first local word lines, and each of the second block select sections is coupled to a jth and the mth cell strings of the first to the meth cell strings through second local word lines, j being an integer larger than one and smaller than m.

A method of operating a semiconductor memory device according to some embodiments includes delivering an enable signal through a block word line selected from a plurality of block word lines based on a block group address; providing the enable signal to a first pass transistor group selected from pass transistor groups coupled to the selected block word line based on a block select signal; activating the first pass transistor group; and accessing a memory block coupled to the first pass transistor group.

The present invention provides a semiconductor memory device with a reduced area.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
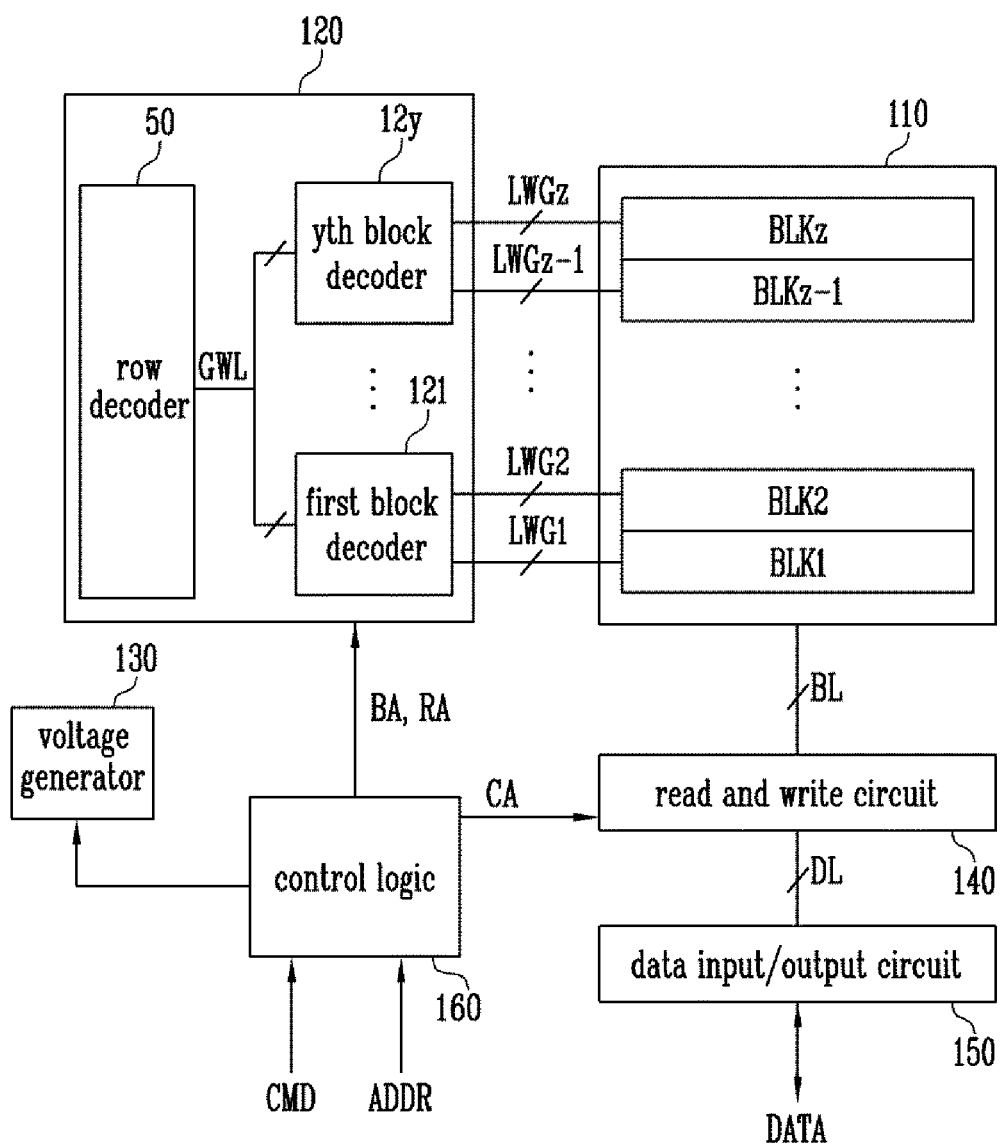
FIG. 1 is a block diagram illustrating a semiconductor memory device according to some embodiments.

FIG. 1 is a block diagram illustrating a semiconductor memory device according to some embodiments.

In FIG. 1, the semiconductor memory device may include a memory cell array 110, an address decoder 120, a voltage generator 130, a read and write circuit 140, a data input/output circuit 150, and a control logic 160.

The memory cell array 110 may include memory blocks BLK1-BLKz. Each of the memory blocks BLK1-BLKz may be coupled to the address decoder 120 through a first to a zth local word line groups LWG1-LWGz. The memory blocks BLK1-BLKz may be coupled to the read and write circuit 140 through bit lines BL. Each of the memory blocks BLK1-BLKz may include memory cells. In some embodiments, the memory cells may be non-volatile memory cells.

In FIG. 1, two memory blocks in the memory cell array 110 may form one memory block group. Each memory block group may be coupled to one block decoder. In some embodiments, two memory blocks in one memory block group may share one block decoder. For example, a first and a second memory blocks BLK1 and BLK2 in a first memory block group BG1 may share a first block decoder 121. A (z−1)th and a zth memory blocks BLKz−1, BLKz in an yth memory block group BGy may share an y block decoder 12y.

The address decoder 120 may include a row decoder 50 and the first to the yth block decoders 121-12y. The address decoder 120 may operate in response to control of the control logic 160. The address decoder 120 may receive a block address BA and a row address RA from the control logic 160.

The first to the yth block decoders 121-12y may be coupled to the row decoder 50 through global word lines GWL. The first to the yth block decoders 121-12y may be coupled to the memory blocks BLK1-BLKz through the local word line groups LWG1-LWGz. One block decoder, e.g. 121 may be coupled to two local word line groups, e.g. LWG1 and LWG2 as shown in FIG. 1, and thus it may be shared by two memory blocks, e.g. BLK1 and BLK2. However, it is understood that one memory block decoder could be shared by three or more memory blocks.

The first to the yth block decoders 121-12y may decode the block address BA. The first to the yth block decoders 121-12y may electrically connect the global word lines GWL to one local word line group, e.g. LWG1 based on the decoded block address, thereby selecting corresponding memory block, e.g. BLK1.

The row decoder 50 may be coupled to the first to the yth block decoders 121-12y through the global word lines GWL. The row decoder 50 may receives voltages for driving the global word lines GWL from the voltage generator 130. The row decoder 50 may decode the row address RA. The row decoder 50 may supply voltages to the global word lines GWL according to the decoded row address, thereby selecting one global word line.

As a result, one memory block may be selected according to the block address BA, and one global word line may be selected in accordance with the row address RA.

An erase operation of the semiconductor memory device 100 may be performed in the unit of a memory block. In the erase operation, the address ADDR may include the block address BA. The address decoder 120 may select one memory block according to the block address BA.

A read operation and a program operation of the semiconductor memory device may be performed in the unit of a page. In the read operation and the program operation, the address ADDR may include the block address BA, the row address RA, and a column address CA. The address decoder 120 may select one memory block and one global word line according to the block address BA and the row address RA.

In some embodiments, the address decoder 120 may include a block decoder, a row decoder, an address buffer, etc.

The voltage generator 130 may generate voltages using an external voltage supplied to the semiconductor memory device 100. The voltage generator 130 may operate in response to control of the control logic 160. The voltage generator 130 may regulate the external voltage or amplify the external voltage using pumping capacitors to generate the voltages.

The read and write circuit 140 may be coupled to the memory blocks BLK1-BLKz through the bit lines BL. The read and write circuit 140 may be coupled to the data input/output circuit 150 through data lines DL. The read and write circuit 140 may operate in response to control of the control logic 160. The read and write circuit 140 may receive the column address CA through the control logic 160. The read and write circuit 140 may decode the column address CA.

In the program operation and the read operation, the read and write circuit 140 may communicate data DATA with the input/output circuit 150 through the data lines DL. In the program operation, the read and write circuit 140 may receives data DATA to be programmed through the data lines DL. The read and write circuit 140 may deliver the received data DATA to bit lines corresponding to the decoded column address of the bit lines BL. The delivered data DATA may be programmed to memory cells of a selected word line. In the read operation, the read and write circuit 140 may read data from memory cells of a selected word line through the bit lines corresponding to the decoded column address of the bit lines BL. The read and write circuit 140 may output the read data DATA through the data lines DL. In an erase operation, the read and write circuit 140 may float bit lines BL.

In some embodiments, the read and write circuit 140 may include page buffers (or page registers), a column decoder, a column select circuit, etc.

The data input/output circuit 150 may be coupled to the read and write circuit 140 through the data lines DL. The data input/output circuit 150 may operate in response to control of the control logic 160. The data input/output circuit 150 may exchange the data DATA with an external device or an input/output buffer (not shown) in the semiconductor memory device 100.

The control logic 160 may receive a command CMD and the address ADDR from the external device or the input/ output buffer in the semiconductor memory device 100. The control logic 160 may control operation of the semiconductor memory device 100 in response to the command CMD. The control logic 160 may control the address decoder 120, the voltage generator 130, the read and write circuit 140, and the data input/output circuit 150. The control logic 160 may deliver the block address BA and the row address RA of the address ADDR to the address decoder 120, and deliver the column address CA of the address ADDR to the read and write circuit 140.

The semiconductor memory device 100 may further include the input/output buffer (not shown). The input/output buffer may receive the command CMD and the address ADDR from the external device, and transmit the received command CMD and the address ADDR to the control logic 160. The input/output buffer may receive the data DATA from the external device and deliver the received data DATA to the data input/output circuit 150. The input/output buffer may deliver the data DATA provided from the data input/output circuit 150 to an external device.

In some embodiments, the semiconductor memory device may be a flash memory device.

Figure 2:
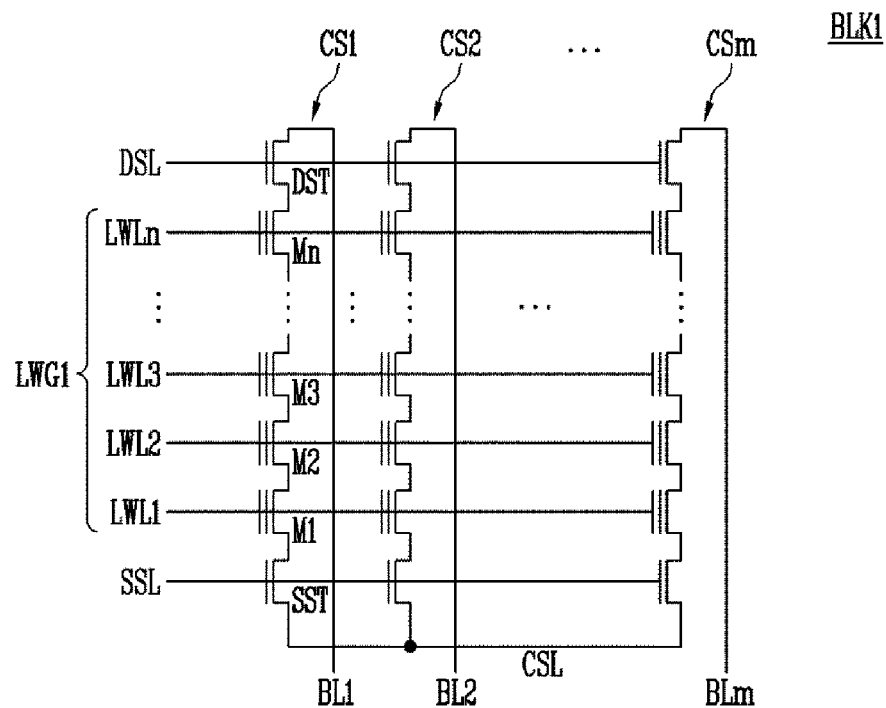
FIG. 2 is a circuit diagram of one of the memory blocks in FIG. 1 according to some embodiments.

FIG. 2 is a circuit diagram of one of the memory blocks BLK1-BLKz in FIG. 1 according to some embodiments.

In FIG. 2, the first memory block BLK1 may be coupled to the read and write circuit (140 in FIG. 1) through a first to an mth bit lines BL1-BLm. The first memory block BLK1 may be coupled to the address decoder (120 in FIG. 1) through the first to the nth local word lines LWL1-LWLn, a source select line SSL, and a drain select line DSL. The first to the nth local word lines LWL1-LWLn may be included in the first local word line group LWG1.

The first memory block BLK1 may include a first to an mth cell strings CS1-CSm. The first to the mth cell strings CS1-CSm may be coupled to the first to the mth bit lines BL1-BLm, respectively. Each of the cell strings may include a source select transistor coupled to the source select line SSL, a first to an nth memory cells M1-Mn coupled to the first to the nth local word lines LWL1-LWLn respectively, and a drain select transistor DST coupled to the drain select line DSL. A source terminal of the source select transistor SST in each of the cell strings may be coupled to a common source line CSL. A drain terminal of the drain select transistor DST in each of the cell strings may be coupled to corresponding bit line.

In some embodiments, each of the memory cells may be a single level cell. In some embodiments, each of the memory cells may be a multi level cell. When each of the memory cells is the single level cell, memory cells coupled to one word line may form one page. When each of the memory cells is the multi level cell, memory cells coupled to one word line may form two or more pages. For the purposes of illustration, only embodiments in which each of the memory cells is the single level cell are described in detail. In some examples, memory cells coupled to a kth local word line LWLk may form a kth page, k being an integer ranging from 1 to n.

The second to the zth memory blocks (BLK2-BLKz in FIG. 1) may have substantially the same structure as the first memory block BLK1 as shown in FIG. 2.

Figure 3:
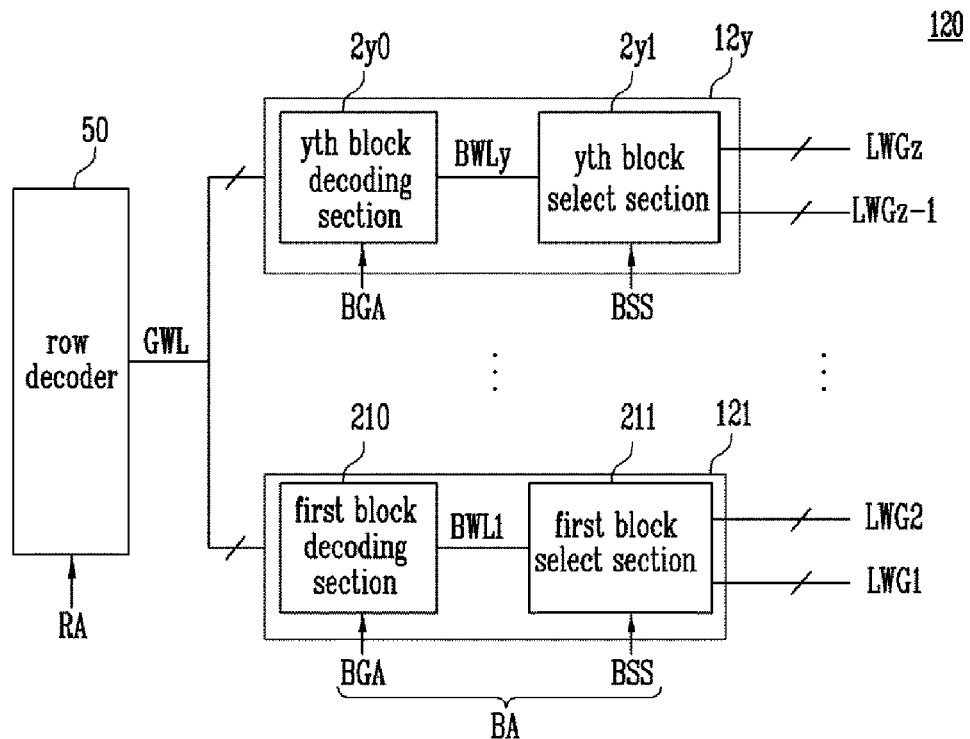
FIG. 3 is a block diagram illustrating the address decoder in FIG. 1 according to some embodiments.

FIG. 3 is a block diagram illustrating the address decoder in FIG. 1 according to some embodiments.

In FIG. 3, the row decoder 50 may receive the row address RA and drive global word lines GWL in response to the row address RA. The first to the yth block decoders 121-12y may receive a block group address BGA and a block select signal BSS. The block group address BGA and the block select signal BSS may be included in the block address BA in FIG. 1. The block group address BGA may have data bits, and the block select signal may include one data bit.

Each of the first to the yth block decoders 121-12y may include one block decoding section and one block select section. A first to an yth block decoding sections 210-2y0 may be coupled to a first to an yth block word lines BWL1-BWLy, respectively. The first to the yth block word lines BWL1-BWLy may be coupled to a first to an yth block select sections 211-2y1, respectively. Each of the first to the yth block select sections 211-2y1 may be coupled to two local word line groups.

The first to the yth block decoding sections 210-2y0 may select one of the first to the yth block word lines BWL1-BWLy in response to the block group address BGA. An activated enable signal may be delivered through one of the first to the yth block word lines BWL1-BWLy based on the block group address BGA, and inactivated enable signals may be delivered through the other block word lines. In some embodiments, only one block word line may be selected by the block group address BGA.

Each of the first to the yth block select sections 211-2y1 may be coupled between the global word lines GWL and corresponding local word line groups. In some examples, the first block select section 211 may be coupled between the global word lines GWL and a first and a second local word line groups LWG1 and LWG2. The yth block select section 2y1 may be coupled between the global word lines GWL and a zth and a (z−1)th local word line groups LWGz−1 and LWGz.

The first to the yth block select sections 211-2y1 may receive the block select signal BSS in common, and operate in response to the block select signal BSS. The block select signal BSS may include one bit. Each of the first to the yth block select sections 211-2y1 may select one of corresponding local word line groups in response to the block select signal BSS, and electrically connect the selected local word line group to the global word lines GWL.

Figure 4:
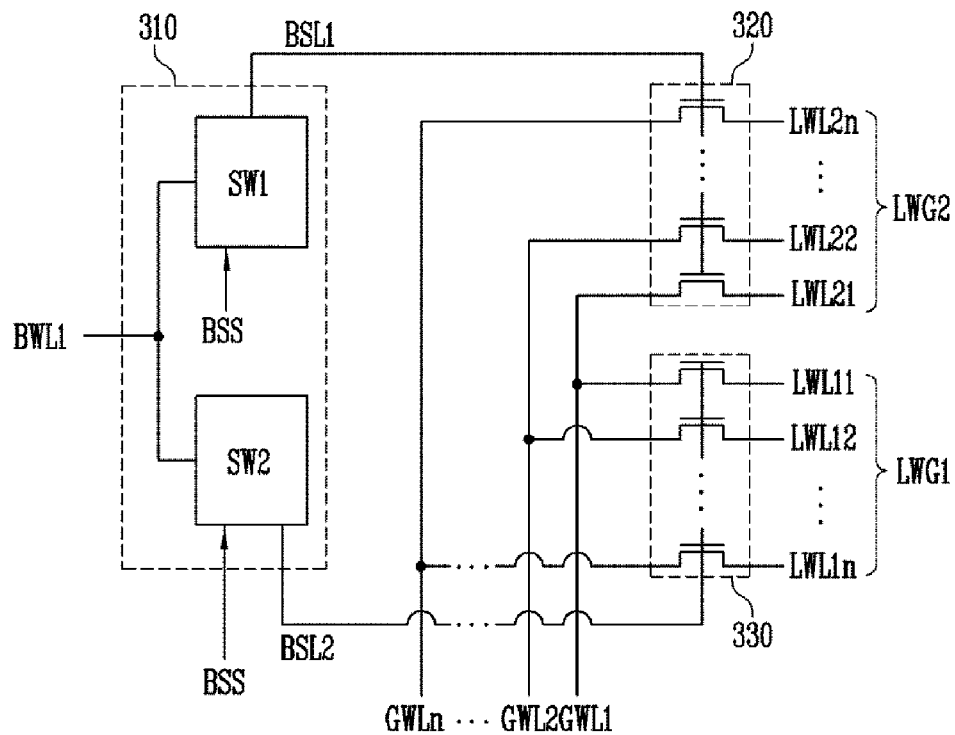
FIG. 4 is a block diagram illustrating one of the block select sections in FIG. 3 according to some embodiments.

FIG. 4 is a block diagram illustrating one of the block select sections 211-2y1 in FIG. 3 according to some embodiments.

In FIG. 4, the first block select section 211 may include a memory block selector 310 and a first and a second pass transistor group 320 and 330 respectively. The memory block selector 310 may include a first switching circuit SW1 and a second switching circuit SW2. The first switching circuit SW1 may be coupled between the first block word line BWL1 and a first block select line BSL1, and the second switching circuit SW2 may be coupled between the first block word line BWL1 and a second block select line BSL2.

The first switching circuit SW1 may electrically connect the first block word line BWL1 to the first block select line BSL1 in response to the block select signal BSS. The second switching circuit SW2 may electrically connect the first block word line BWL1 to the second block select line BSL2 in response to the block select signal BSS.

In some embodiments, the memory block selector 310 may deliver the enable signal received through the first block word line BWL1 to the first block select line BSL1 or the second block select line BSL2, based on the block select signal BSS.

Each of the first and the second pass transistor groups 320 and 330 may include transistors. In some embodiments, the transistors may be NMOS transistors.

The first pass transistor group 320 may be coupled between the global word lines GWL1-GWLn and the first to the nth local word lines LWL21-LWL2n. The first to the nth local word lines LWL21-LWL2n may form the second local word line group LWG2 in FIG. 3.

The first pass transistor group 320 may be activated when the enable signal received through the first block word line BWL1 is a logic high. When the first pass transistor group 320 is activated, the global word lines GWL1-GWLn may be electrically connected to the first to the nth local word lines LWL21-LWL2n, respectively. In some embodiments, when the second memory block BLK2 is selected, the global word lines GWL1-GWLn may be electrically connected to the first to the nth local word lines LWL21-LWL2n, respectively.

The second pass transistor group 330 may be coupled between the global word lines GWL1-GWLn and the first to the nth local word lines LWL11-LWL1n. Here, the first to the nth local word lines LWL11-LWL1n may form the first local word line group LWG1 in FIG. 3.

The second pass transistor group 330 may connect the global word lines GWL1-GWLn to the corresponding first to the nth local word lines LWL11-LWL1n, in response to the enable signal received through the second block word line BWL2.

The second to the yth block select sections 212-2y1 in FIG. 3 may have a similar structure as the first block select section 211.

In some embodiments, one block decoder may be shared by the memory blocks. Accordingly, a size of the semiconductor memory device may be reduced relative to a semiconductor memory device where one block decoder corresponds to only one memory block.

In some embodiments, though the memory blocks share one block decoder, only the global word lines GWL in one group are required for driving the semiconductor memory device according to the memory block selector 310. Accordingly, a size of the semiconductor memory device may be reduced.

Figure 5:
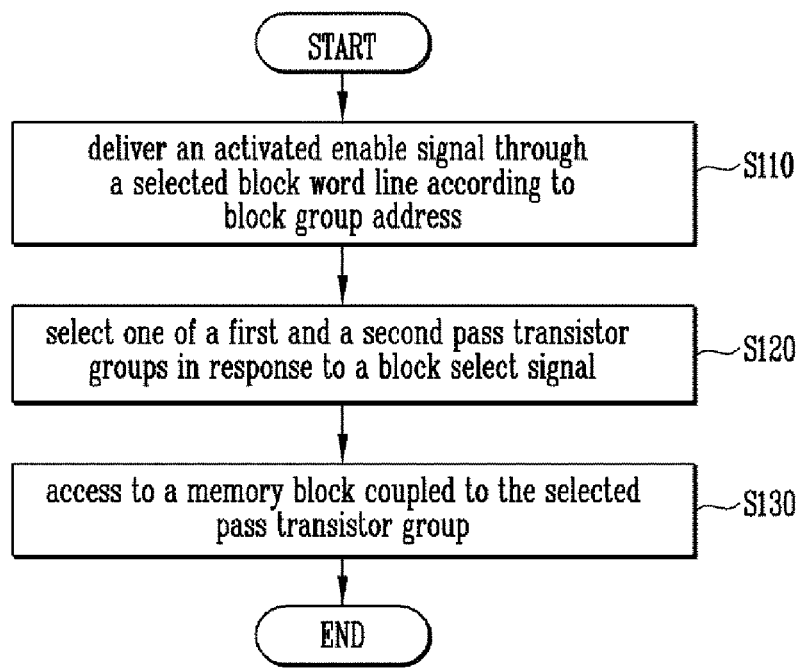
FIG. 5 is a flowchart illustrating a method of operation of a semiconductor memory device according to some embodiments.

FIG. 5 is a flowchart illustrating a method of operation of a semiconductor memory device according to some embodiments. Further embodiments will be described as though the first block word line BWL1 is selected, although the operation may be similarly applied to block word lines BWL2-BWLy.

In FIG. 3 to FIG. 5, the activated enable signal may be delivered through the block word line BWL1 selected in accordance with the block group address BGA of the block address BA in step S110. In some examples, the enable signal has logic high when the enable signal is activated.

In step S120, one of the first and the second pass transistor groups 320 or 330 may be selected in response to the block select signal BSS. The activated enable signal may be provided to the selected pass transistor group, e.g. 330. As a result, pass transistors in the selected pass transistor group may be turned on. In addition, the local word lines, e.g. LWL11-LWL1n coupled to the selected pass transistor group may be electrically connected to the global word lines GWL1-GWLn.

In step S130, a memory block coupled to the selected pass transistor group may be accessed. A program operation, a read operation, or an erase operation to the memory block coupled to the selected pass transistor group may be performed.

Figure 6:
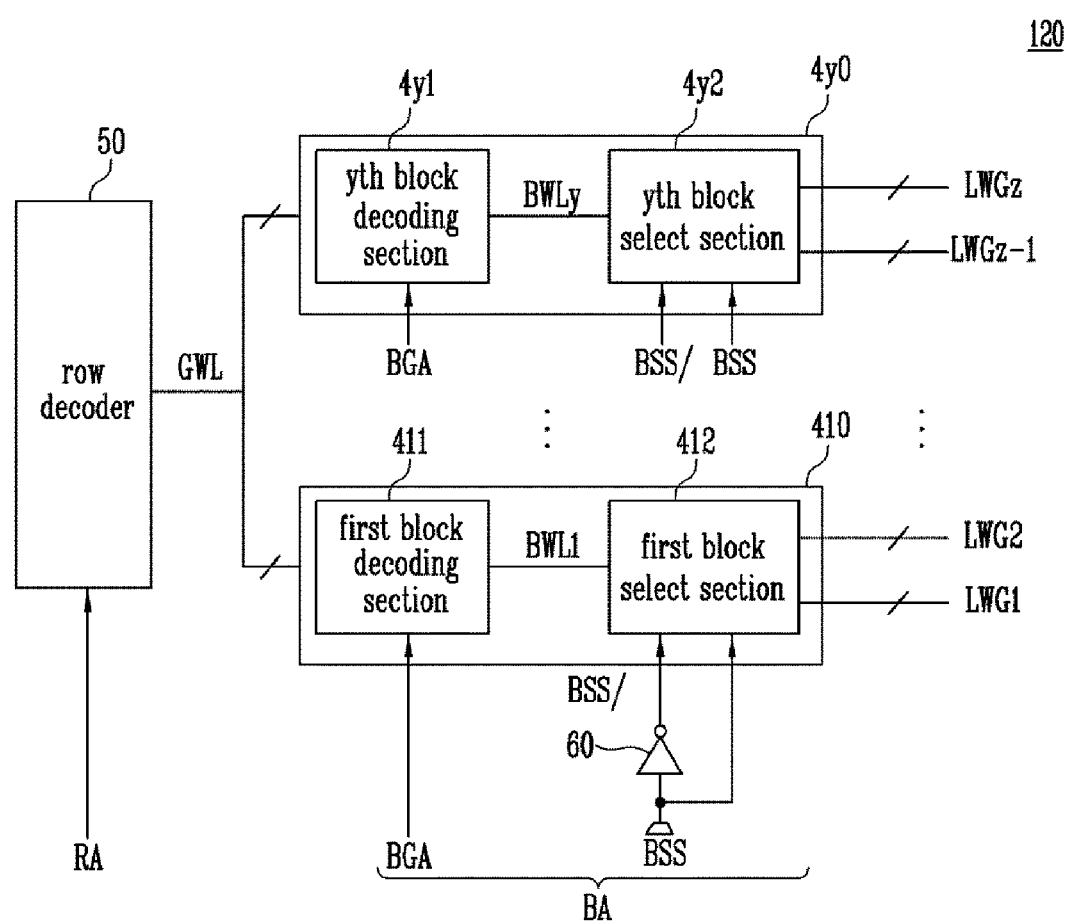
FIG. 6 is a block diagram illustrating an address decoder in FIG. 1 according to some embodiments.

FIG. 6 is a block diagram illustrating an address decoder in FIG. 1 according to some embodiments.

In FIG. 6, the address decoder 120 may include a row decoder 50, a first to an yth block decoders 410-4y0, and an inverter 60.

The inverter 60 may receive the block select signal BSS and generate an inverted block select signal BSS/. The block select signal BSS and the inverted block select signal BSS/ may be transmitted to the first to the yth block select sections 412-4y2.

Figure 7:
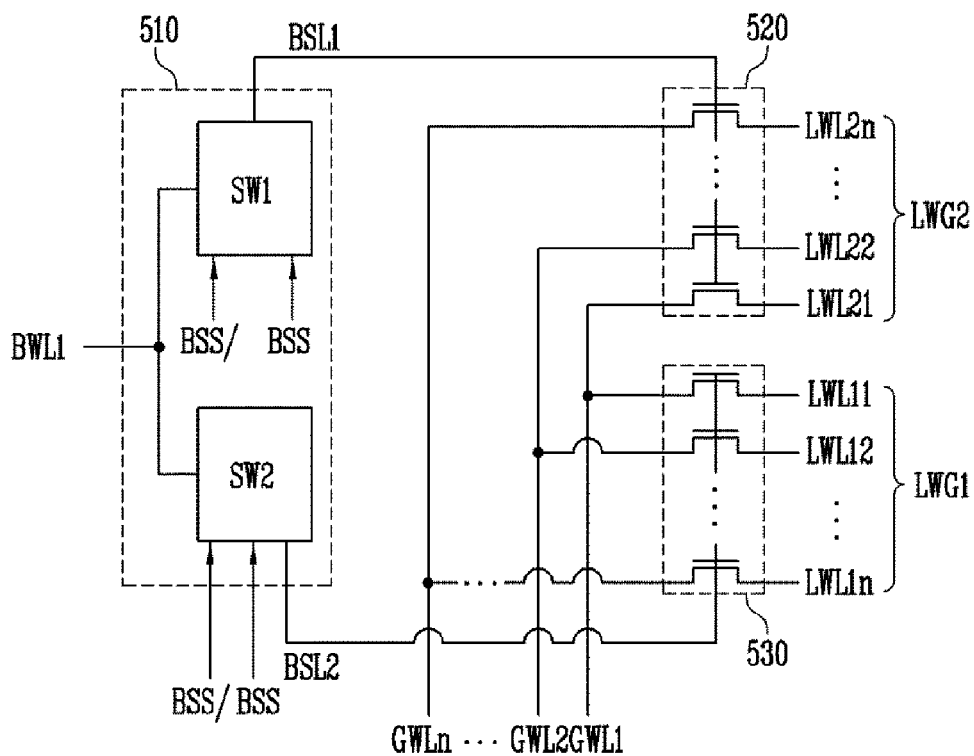
FIG. 7 is a block diagram illustrating one of the block select sections in FIG. 6 according to some embodiments.

FIG. 7 is a block diagram illustrating one of the block select section 412-4y2 in FIG. 6 according to some embodiments.

In FIG. 7, the block select section 412 may include a memory block selector 510, and a first and a second pass transistor groups 520 and 530. The memory block selector 510 may receive the block select signal BSS and the inverted block select signal BSS/.

A first switching circuit SW1 may couple a first block word line BWL1 to a first block select line BSL1 in response to the block select signal BSS and the inverted block select signal BSS/. The second switching circuit SW2 may couple the first block word line BWL1 to a second block select line BSL2 in response to the block select signal BSS and the inverted block select signal BSS/.

Figure 8:
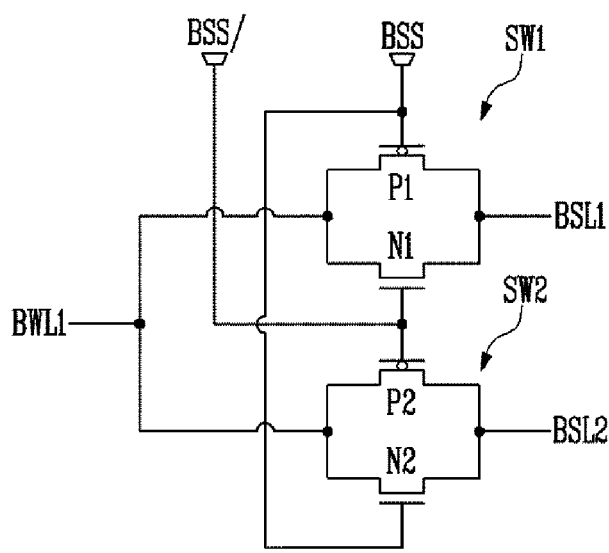
FIG. 8 is a circuit diagram illustrating the memory block selector in FIG. 7 according to some embodiments.

FIG. 8 is a circuit diagram illustrating the memory block selector in FIG. 7 according to some embodiments.

In FIG. 8, the first switching circuit SW1 may include a first PMOS transistor P1 and a first NMOS transistor N1. The first PMOS transistor P1 may operate in response to the block select signal BSS, and the first NMOS transistor N1 may operate in response to the inverted block select signal BSS/.

The second switching circuit SW2 may include a second PMOS transistor P2 and a second NMOS transistor N2. The second PMOS transistor P1 may operate in response to the inverted block select signal BSS/, and the second NMOS transistor N1 may operate in response to the block select signal BSS.

In some embodiments, when the block address signal BSS has logic low and the inverted block select signal BSS/ has logic high, the first switching circuit SW1 may couple the first block word line BWL1 to the first block select line BSL1, and the first block word line BWL1 may not be coupled to the second block select line BSL2.

In some embodiments, when the block address signal BSS has logic high and the inverted block select signal BSS/ has logic low, the second switching circuit SW2 may electrically connect the first block word line BWL1 to the second block select line BSL2, and the first block word line BWL1 may not be coupled to the first block select line BSL1.

In some embodiments, the memory block selector 510 may operates in response to the block select signal BSS and the inverted block select signal BSS/. Accordingly, a reliability of operation of the memory block selector 510 may be enhanced.

Figure 9:
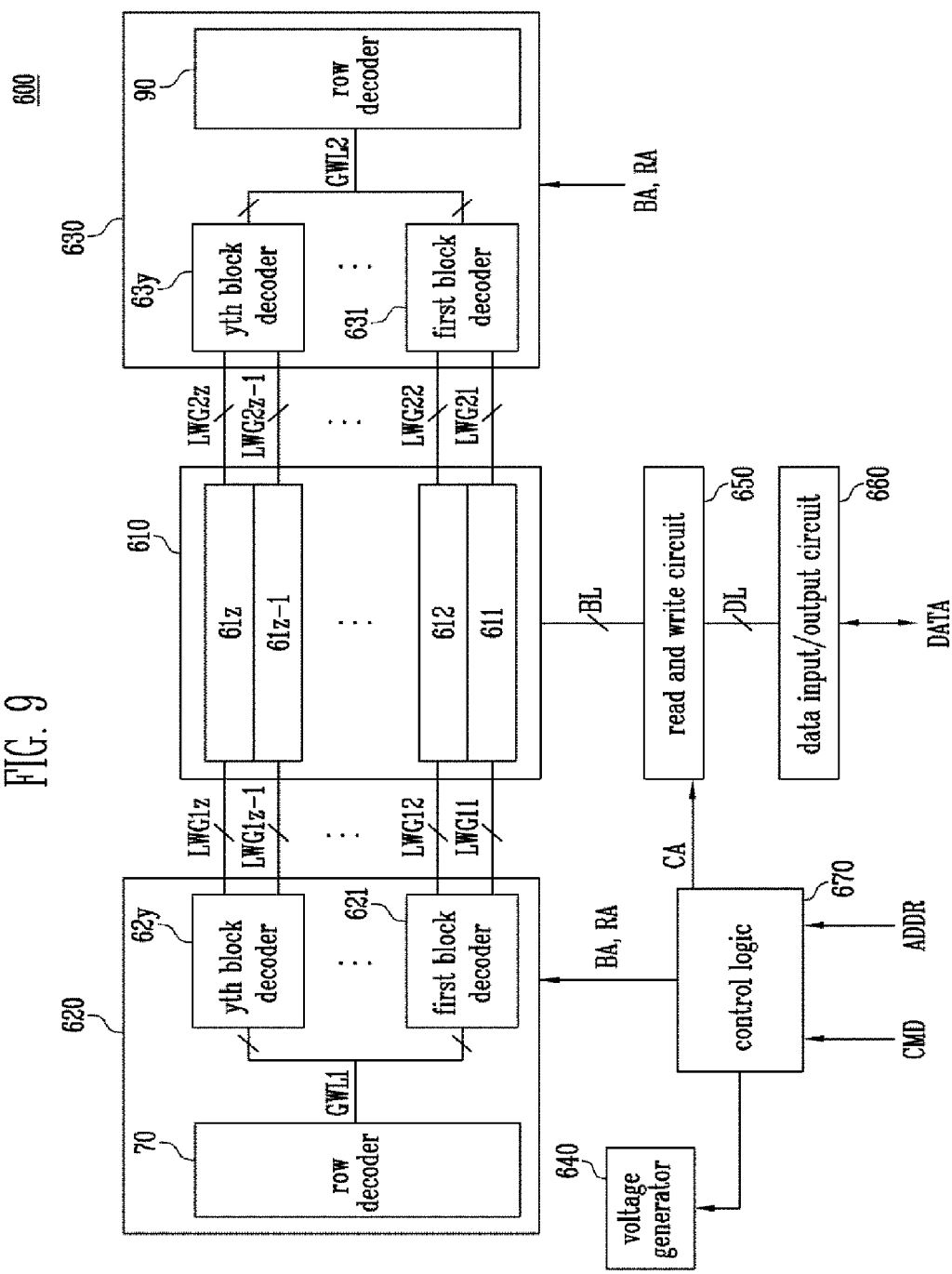
FIG. 9 is a block diagram illustrating a semiconductor memory device according to some embodiments.

FIG. 9 is a block diagram illustrating a semiconductor memory device according to some embodiments.

In FIG. 9, the semiconductor memory device 600 may include a memory cell array 610, a first and a second address decoders 620 and 630, a voltage generator 640, a read and write circuit 650, a data input/output circuit 660, and a control logic 670.

The voltage generator 640, the read and write circuit 650, the data input/output circuit 660, and the control logic 670 may have substantially the same structure as the voltage generation 130, the read and write circuit 140, the data input/output circuit 150, and the control logic 160 respectively as shown in FIG. 1.

The first to the second address decoders 620 and 630 may select one word line of one memory block according to a block address BA and a row address RA. The first to the second address decoders 620 and 630 may perform substantially the same function as the address decoder 120 in FIG. 1.

The first address decoder 620 may include a row decoder 70, and a first to an yth block decoders 621-62y. The row decoder 70 may decode the row address RA. The row decoder 70 may drive first global word lines GWL1 according to the decoded row address. The row decoder 70 may drive the first global word lines GWL1 using voltages supplied by the voltage generator 640.

The first to the yth block decoders 621-62y may decode the block address BA. The first to the yth block decoders 621-62y may electrically connect the first global word lines GWL1 to one local word line group, e.g. LWG11, based on the decoded block address, thereby selecting one memory block, e.g. 611.

The second address decoder 630 may include a row decoder 90, and a first to an yth block decoders 631-63y. The row decoder 90 may receive the row address RA from the control logic 670. The row decoder 90 may decode the row address RA and drive second global word lines GWL2 according to the decoded row address RA.

The first to the yth block decoders 631-63y may receive the block address BA from the control logic 670. The first to the yth block decoders 631-63y may decode the block address BA. The first to the yth block decoders 631-63y may select one memory block according to the decoded block address.

The block decoders 621-62y in the first address decoder 620 and the block decoders 631-63y in the second address decoder 630 may decode the same block address BA, and thus they may select the same memory block. In some embodiments, the block decoders 621-62y in the first address decoder 620 may have substantially the same structure as the first to the yth block decoders 121-12y in FIG. 1, and the block decoders 631-63y in the second decoder 630 may have substantially the same structure as the first to the yth block decoders 121-12y in FIG. 1.

In some embodiments, odd-numbered pages in each of memory blocks in the memory cell array 610 may be coupled to the first address decoder 620, and even-numbered pages in each of the memory blocks in the memory cell array 610 may be coupled to the second address decoder 630. This will be described in further detail with reference to accompanying drawing FIG. 10.

Figure 10:
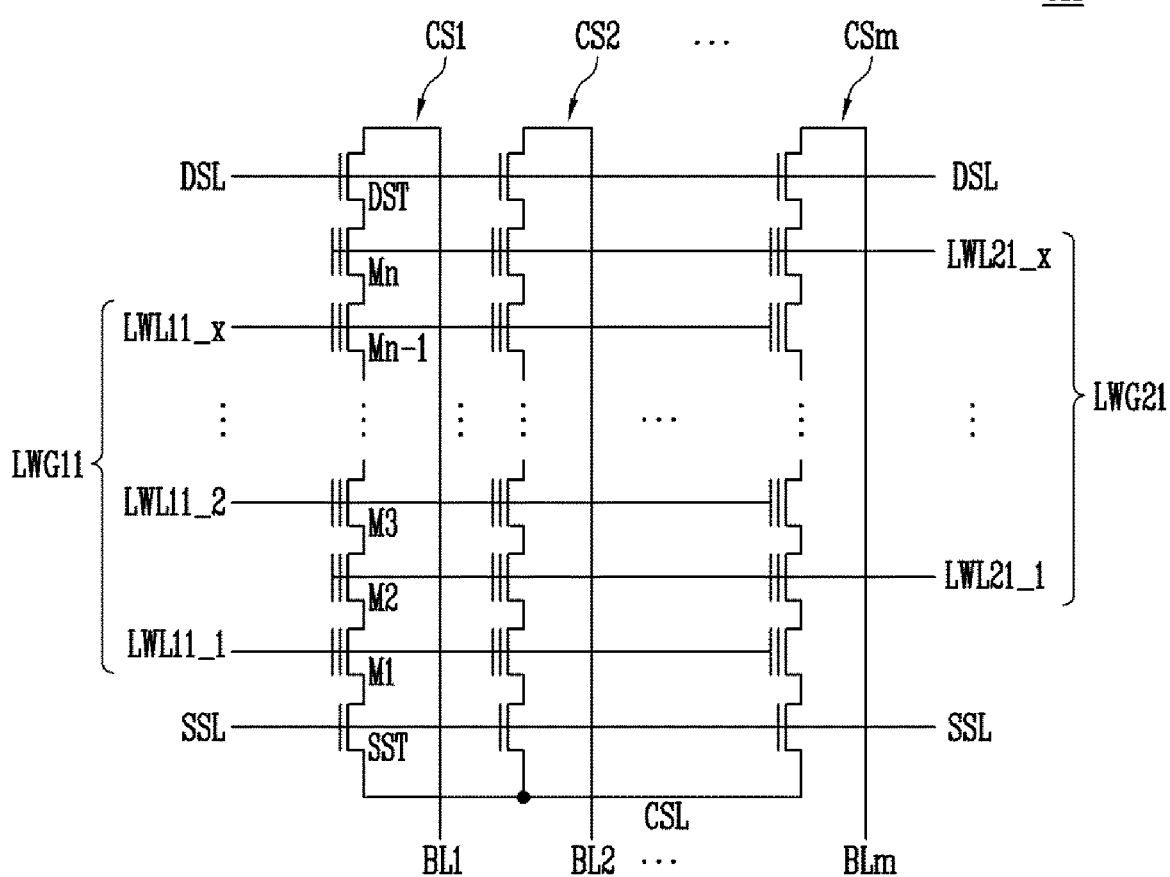
FIG. 10 is a circuit diagram illustrating one of the memory blocks in FIG. 9 according to some embodiments.

FIG. 10 is a circuit diagram illustrating one of the memory blocks 611-61z in FIG. 9 according to some embodiments.

In FIG. 10, odd-numbered pages in a first memory block 611 may be coupled to the first address decoder 620 through a first to an x local word lines LWL11_1-LWL11_x, respectively. Even-numbered pages in the first memory block 611 may be coupled to the second address decoder 630 through a first to an xth local word lines LWL21_1-LWL21_x, respectively. A drain select transistor DST in each cell string may be coupled to the first and the second address decoders 620 and 630 through a drain select line DSL. A source select transistor SST in each cell string may be coupled to the first and the second address decoders 620 and 630 through a source select line SSL.

In some embodiments, the number of the local word lines LWL11_1-LWL11_x coupled to the odd-numbered pages and the local word lines LWL21_1-LWL21_x coupled to the even-numbered pages may be substantially identical to a number of the first to the nth local word lines LWL1-LWLn in FIG. 1.

In some embodiments, pages in each of the memory blocks in the memory cell array 610 may be coupled in common to the first address decoder 620 and 630. In some embodiments, memory cells disposed in a left portion of each of the memory blocks may be coupled to the first address decoder 620, and memory cells disposed in a right portion of each of the memory blocks may be coupled to the second address 630. This will be described in further detail with reference to accompanying drawing FIG. 11.

Figure 11:
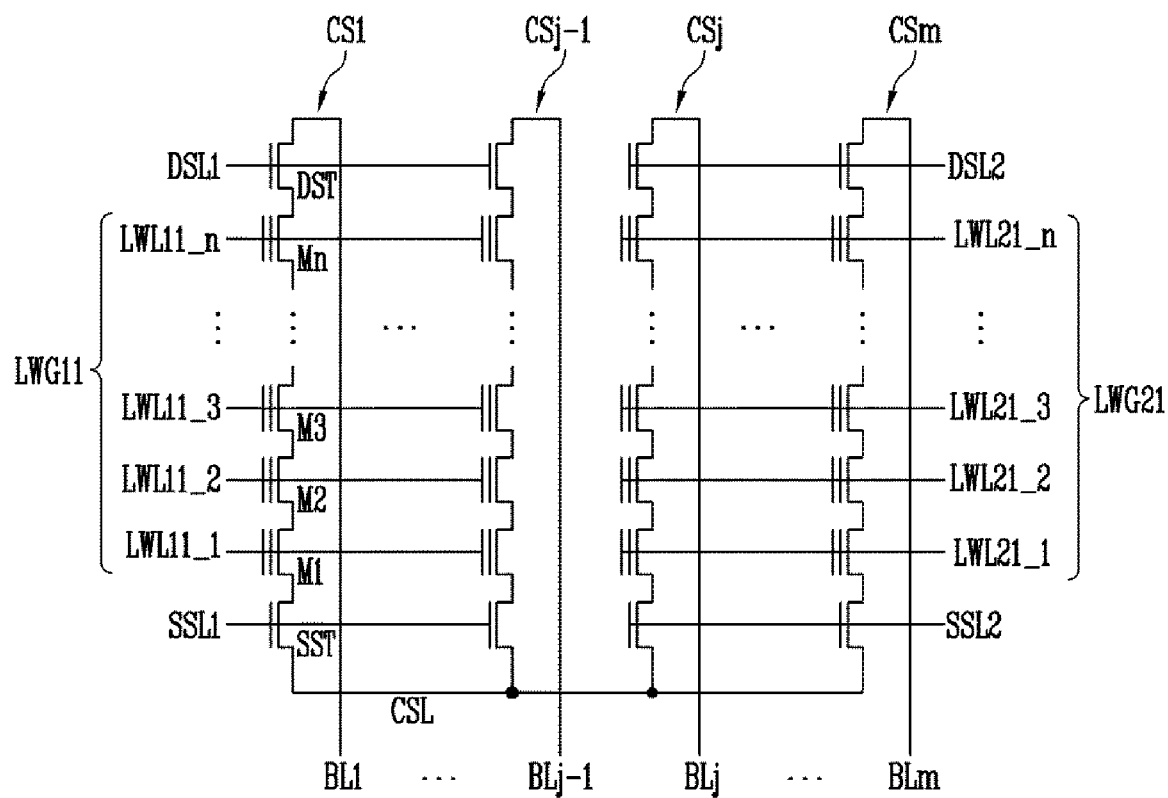
FIG. 11 is a view illustrating one of the memory blocks in FIG. 9 according to some embodiments.

FIG. 11 is a view illustrating one of the memory blocks 611-61z in FIG. 9 according to some embodiments.

In FIG. 11, memory cells included in a first to a (j−1)th cell strings CS1-CSj−1 may be coupled to the first address decoder 620 through the first to the nth local word lines LWL11_1-LWL11_n. Memory cells included in a jth to an mth cell strings CSj-CSm may be coupled to the second address decoder 630 through the first to the nth local word lines LWL21_1-LWL21_n. A drain select transistor DST and a source select transistor SST in each of the first to the (j−1)th cell strings CS1-CSj−1 may be coupled to the first address decoder 620 through a first drain select line DSL1 and a first source select line SSL1. A drain select transistor DST and a source select transistor SST in each of the jth to the mth cell strings CSj-CSm may be coupled to the second address decoder 630 through a second drain select line DSL2 and a second source select line SSL2.

A length of each of the local word lines in FIG. 11 may be smaller than that of each of the local word lines in FIG. 10. As a result, a loading time of the local word line in FIG. 11 may be reduced when a specific voltage is supplied to the local word line. That is, the local word line may more rapidly reach a target voltage. Accordingly, the semiconductor memory device in FIG. 11 may have an enhanced operation rate.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:
1. An address decoder comprising:
  pass transistor groups coupled to memory blocks, respectively;
  a memory block selector coupled in common to the pass transistor groups; and
  a block decoding section coupled to the memory block selector through a block word line, and configured to deliver an enable signal through the block word line based on a block group address,
  wherein the memory blocks are coupled in common to a plurality of bit lines coupled to a read and write circuit, and
  wherein the memory block selector is configured to deliver the enable signal to a first pass transistor group selected from the pass transistor groups according to a block select signal to activate the first pass transistor group to select a memory block coupled to the first pass transistor group.
2. The address decoder of claim 1 wherein the block group address and the block select signal are included in a block address received from an external circuit for accessing a memory block.
3. The address decoder of claim 1 wherein:
  each of the pass transistor groups is coupled between local word lines and global word lines; and
  the first pass transistor group electrically connects the local word lines to the global word lines.
4. The address decoder of claim 3, further comprising a row decoder configured to control the global word lines according to a row address.
5. The address decoder of claim 1, wherein:
  the pass transistor groups further include a second pass transistor group;
  the block select signal is defined by one data bit; and the memory block selector delivers the enable signal to one of the first pass transistor group and the second pass transistor group based on the block select signal.

6. The address decoder of claim 5 wherein the memory block selector comprises:
a first switching circuit coupled between the first pass transistor group and the block word line; and
a second switching circuit coupled between the second pass transistor group and the block word line;
wherein the first switching circuit and the second switching circuit operate in response to the block select signal.

7. The address decoder of claim 6 wherein:
the first switching circuit delivers the enable signal to the first pass transistor group when the block select signal has logic low; and
the second switching circuit delivers the enable signal to the second pass transistor group when the block select signal has logic high.

8. The address decoder of claim 1, further comprising:
an inverter configured to receive the block select signal and generate an inverted block select signal;
wherein the memory block selector delivers the enable signal to the first pass transistor group in response to the block select signal and the inverted block select signal.

9. A semiconductor memory device comprising:
memory block groups, each of the memory block groups including memory blocks;
first block select sections, each of the first block select sections being coupled to a respective memory block group selected from the memory block groups and configured to receive a block select signal in common; and
first block decoding sections, each of the first block decoding sections being coupled to a respective block selection section selected from the first block select sections,
wherein memory blocks of the memory block groups are coupled in common to a plurality of bit lines coupled to a read and write circuit,
wherein a block select section from the first block select sections is selected based on a block group address, and
wherein the selected block select section is configured to select a first memory block in a corresponding one of the memory block groups based on the block select signal.

10. The semiconductor memory device of claim 9 wherein the block group address and the block select signal are included in a block address received from an external circuit for accessing the first memory block.

11. The semiconductor memory device of claim 9 wherein:
each of the first block select sections is coupled to global word lines; and
the selected block select section electrically connects the global word lines to local word lines coupled to the first memory block.

12. The semiconductor memory device of claim 11, further comprising a row decoder coupled to the first block select sections through the global word lines, and configured to drive the global word lines according to a row address.

13. The semiconductor memory device of claim 9 wherein:
each of the memory block groups includes:
a second memory block coupled to first local word lines; and
a third memory block coupled to second local word lines;
each of the first block select sections comprises:
a first pass transistor group coupled between the first local word lines and global word lines;
a second pass transistor group coupled between the second local word lines and the global word lines; and
a memory block selector configured to activate one of the first pass transistor group and the second pass transistor group based on the block select signal to select one of the second memory block and the third memory block.

14. The semiconductor memory device of claim 9 wherein:
the block select signal is defined by one data bit; and
the selected block select section selects one of the first memory block and a second memory block in the corresponding memory block group based on the block select signal.

15. The semiconductor memory device of claim 9, further comprising:
second block select sections, each of the second block select sections being coupled to a respective memory block group selected from the memory block groups and configured to receive the block select signal in common; and
second block decoding sections, each of the second block decoding sections being coupled to a respective block selection section selected from the second block select section;
wherein a block selection section from the second block select sections is selected based on the block group address;
wherein the selected second block select section selects the first memory block in the corresponding memory block group based on the block select signal.

16. The semiconductor memory device of claim 15 wherein:
each of the memory blocks includes a first to an mth cell strings disposed in sequence, m being a positive integer;
each of the first block select sections is coupled to a first to a (j−1)th cell strings of the first to the mth cell strings through first local word lines; and
each of the second block select sections is coupled to a jth and the mth cell strings of the first to the mth cell strings through second local word lines, j being an integer larger than one and smaller than m.

17. A method of operating a semiconductor memory device, the method comprising:
delivering an enable signal through a block word line selected from a plurality of block word lines based on a block group address;
providing the enable signal to a first pass transistor group selected from pass transistor groups coupled to the selected block word line based on a block select signal, the pass transistor groups coupled to memory blocks, respectively;
activating the first pass transistor group; and
accessing a memory block coupled to the first pass transistor group,
wherein the memory blocks are coupled in common to a plurality of bit lines coupled to a read and write circuit.

18. The method of claim 17 wherein the block group address and the block select signal are included in a block address received from an external circuit for accessing the memory block coupled to the first pass transistor group.

19. The method of claim 18, further comprising:
receiving the block address and a row address; and
controlling global word lines based on the row address;
wherein each of the pass transistor groups is coupled between corresponding local word lines and the global word lines.

* * * * *